United States Patent
Ma et al.

(10) Patent No.: US 9,362,351 B2
(45) Date of Patent: Jun. 7, 2016

(54) FIELD EFFECT TRANSISTOR, TERMINATION STRUCTURE AND ASSOCIATED METHOD FOR MANUFACTURING

(71) Applicant: Chengdu Monolithic Power Systems Co., Ltd., Chengdu (CN)

(72) Inventors: Rongyao Ma, Chengdu (CN); Tiesheng Li, San Jose, CA (US); Huaifeng Wang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 1 day.

(21) Appl. No.: 14/290,804

(22) Filed: May 29, 2014

(65) Prior Publication Data

US 2014/0353748 A1    Dec. 4, 2014

(30) Foreign Application Priority Data

May 29, 2013 (CN) .......................... 2013 1 0205319

(51) Int. Cl.

| H01L 29/06 | (2006.01) |
|---|---|
| H01L 29/423 | (2006.01) |
| H01L 29/40 | (2006.01) |
| H01L 29/66 | (2006.01) |
| H01L 29/78 | (2006.01) |
| H01L 29/417 | (2006.01) |

(52) U.S. Cl.
CPC .......... *H01L 29/0634* (2013.01); *H01L 29/407* (2013.01); *H01L 29/4236* (2013.01); *H01L 29/66727* (2013.01); *H01L 29/66734* (2013.01); *H01L 29/7811* (2013.01); *H01L 29/7813* (2013.01); *H01L 29/0619* (2013.01); *H01L 29/41766* (2013.01); *H01L 29/4238* (2013.01)

(58) Field of Classification Search
None
See application file for complete search history.

(56) References Cited

U.S. PATENT DOCUMENTS

| 8,487,372 B1 * | 7/2013 | Hsieh .............. H01L 21/823481 257/330 |
| 2011/0254086 A1 * | 10/2011 | Hsieh .............. H01L 21/823481 257/330 |

* cited by examiner

*Primary Examiner* — Yasser A Abdelaziez
(74) *Attorney, Agent, or Firm* — Perkins Coie LLP

(57) ABSTRACT

A field effect transistor ("FET"), a termination structure and associated method for manufacturing. The FET has a plurality of active transistor cells and a termination structure. The termination structure for the FET includes a plurality of termination cells arranged substantially in parallel from an inner side toward an outer side of a termination area of the FET. Each of the termination cells comprises a termination trench lined with a termination insulation layer and filled with a termination conduction layer. The innermost termination cell is electrically coupled to gate regions of the active transistor cells while the rest of the termination cells are electrically floating.

20 Claims, 8 Drawing Sheets

FIELD EFFECT TRANSISTOR, TERMINATION STRUCTURE AND ASSOCIATED METHOD FOR MANUFACTURING

CROSS-REFERENCE TO RELATED APPLICATION(S)

This application claims the benefit of CN application No. 201310205319.3 filed on May 29, 2013 and incorporated herein by reference.

TECHNICAL FIELD

This disclosure relates generally to semiconductor devices, and particularly but not exclusively relates to field effect transistors ("FETs").

BACKGROUND

Field effect transistors ("FETs"), such as metal oxide semiconductor field effect transistors ("MOSFETs"), junction field effect transistors ("JFETs"), and double diffused metal-oxide semiconductor (DMOS) transistors etc. are widely used in various electronic products. In certain application circumstances, for example, in power management applications, when the FETs are used as switching elements in power supplies, it is generally desired that the FETs have relatively low on resistance, relatively high breakdown voltage, good current handling capability and good ruggedness.

A field effect transistor ("FET") may generally be fabricated on a semiconductor substrate and include a core active area and a termination area. The core active area usually comprises at least one FET cell having a gate, a drain region, and a source region. The gate regulates the conduction and blocking of a channel region in the substrate to control an electrical current flow between the drain region and the source region. The termination area should comprise at least one termination cell which serves to isolate the core active area from the termination area, to block undesired electrical leakage path from the termination area to the core active area, and to improve the breakdown voltage (i.e. the maximum drain to source voltage that the FET can assume without breakdown in its OFF state) of the FET. Increasing the number of FET cells formed in the core active area is beneficial to reducing the on resistance and improving the current handling ability of the FET. In the meanwhile, improving the isolation performance and voltage withstand properties of the termination cell(s) formed in the termination area is beneficial to increasing the breakdown voltage and ruggedness of the FET. A FET may be configured to have a planar gate or a trench gate.

Take a trench gate FET 10 for example, as illustrated in the cross sectional view of FIG. 1, the FET 10 is fabricated on an N type semiconductor substrate 101 having an active area 102 and a termination area 103. In the active area 102, FET cells having trenched gates 104, N+ type source regions 105 and P type body regions 106 are formed in the N type semiconductor substrate 101 that functions as a drain region of the FET 10. The trenched gates 104 are electrically connected to each other. The electrical connection of the trenched gates 104 is illustrated by a dotted line in FIG. 1. Each of the trenched gates 104 is isolated from the source regions 105, the body regions 106 and the substrate 101 by a gate oxide lining the bottom and sidewalls of the gate trench. In the termination area 103, a trenched gate contact 107 is formed. The trenched gate contact 107 is electrically connected (the electrical connection still illustrated by a dotted line) to the trenched gates 104 and has a wider trench width than the trenched gates 104 to facilitate connection to a gate metal 108. In the termination area 103, a plurality of trenched isolation cells 109 are further formed to protect the FET cells in the active area 102. Each of the trenched isolation cells 109 has a same or similar structure as each of the trenched gates 104. A thin oxide layer lining the bottom and sidewalls of each trench of the isolation cells 109 isolates the isolation cell 109 from the body regions 106 and the substrate 101. However, the trenched isolation cells 109, especially the innermost one (the one closest to the active cell area 102) may be vulnerable to high drain to source voltage, and may lead to break-down voltage walk-out (i.e. deviation of break-down voltage from designed value) of the FET 10, which is undesirable. FIG. 2 illustrates a simulated equal potential line distribution diagram of a portion of the trenched isolation cells 109 (e.g. a portion corresponding to the BB' area in FIG. 1) in the FET 10 shown in FIG. 1 when the FET 10 is OFF and a high drain to source voltage (e.g. 30V) is applied between the drain region 101 and the source region 105. It can be seen from FIG. 2 that the equal potential lines near the left side (e.g. the portion looped by the dotted ellipse) of the innermost trenched isolation cell 109 are relatively intensive/close-spaced in comparison with those of other areas, which indicates that the electric field intensity near the left side of the innermost trenched isolation cell 109 is very high. Such a high electric field intensity causes the innermost trenched isolation cell 109 suffer from high voltage pressure, and may lead to walk-out or decrease in break-down voltage of FET 10 or even result in punch-through of the thin oxide layer lining the sidewalls of the trenched termination cell 109, and inducing damage to the FET 10. In addition, in practical application, since the innermost trenched termination cell 109 may suffer from high voltage pressure over and over again during on and off switching of the FET 10, the ruggedness and lifetime of the FET 10 may decrease.

SUMMARY

In view of the above requirements, there has been provided, in accordance with an embodiment of the present disclosure, a field effect transistor. The field effect transistor may include a semiconductor layer of a first conductivity type having an active area and a termination area outside of the active area, a plurality of active transistor cells formed in the active area, a plurality of floating body regions of a second conductivity type disposed in the termination area, and a plurality of termination cells disposed interleaving with the plurality of floating body regions in the termination area, and arranged substantially in parallel from an inner side toward an outer side of the termination area. Each of the transistor cells may have a drain region of the first conductivity type, a source region of the first conductivity type, an active body region of the second conductivity type and a gate region, wherein the source region is located in the active body region and laterally adjacent to both sides of the gate region. Each of the termination cells may include a termination trench opened from a top surface of said semiconductor layer and having sidewalls and a bottom, wherein the termination trench includes a termination insulation layer lining the termination trench sidewalls and bottom, and a termination conduction layer filling the termination trench. The innermost termination cell among the plurality of termination cells isolates the floating body regions from the active body regions so that the floating body regions have floating potentials. The innermost termination cell is electrically coupled to the gate regions of the transistor cells while the rest of the termination cells are electrically floating.

There has also been provided, in accordance with an embodiment of the present disclosure, a termination structure for a field effect transistor. The field effect transistor may include a semiconductor layer of a first conductivity type having an active area and a termination area outside of the active area. The termination structure may have a plurality of floating body regions and a plurality of termination cells. The floating body regions may have a second conductivity type and are disposed in the termination area of the semiconductor layer. The plurality of termination cells may be disposed interleaving with the plurality of floating body regions in the termination area, and are arranged substantially in parallel from an inner side toward an outer side of the termination area. Each of the termination cells may comprise a termination trench opened from a top surface of said semiconductor layer and having sidewalls and a bottom, wherein the termination trench includes a termination insulation layer lining the termination trench sidewalls and bottom, and a termination conduction layer filling the termination trench. The innermost termination cell is electrically coupled to the gate regions of the transistor cells while the rest of the termination cells are electrically floating.

In addition, there has been provided, in accordance with an embodiment of the present disclosure, a method of forming a field effect transistor. The method may comprise: providing a semiconductor layer of a first conductivity type, wherein the semiconductor layer includes an active area and a termination area outside of the active area; forming a plurality of gate regions in the active area; forming a second conductivity type body region in the semiconductor layer, wherein the second conductivity type is opposite to the first conductivity type; forming a plurality of gate regions in the active area; forming a plurality of termination cells in the termination area, and forming a plurality of source regions of the first conductivity type in the active cell area, wherein the source regions are located laterally adjacent to both sides of the gate regions. Forming the termination cells may comprise: forming a plurality of termination trenches opened from a top surface of the semiconductor layer, wherein the plurality of termination trenches are arranged substantially in parallel from an inner side toward an outer side of the termination area, and wherein each of the termination trenches has sidewalls and a bottom; forming a termination insulation layer lining the sidewalls and bottom of each of the termination trenches, and forming a termination conduction layer filling the termination trenches. The method further comprises electrically coupling the innermost termination cell among the plurality of termination cells to the gate regions.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down, "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. The symbols "+" and "−" when used to describe dopants or doped regions/ zones are merely used to descriptively indicate relative dopant concentration levels, but not intend to specify or limit the dopant concentration ranges, nor intend to add other limitations to the dopants and doped regions/zones. For instance, both "N+ type" and "N− type" can be referred to as "N type" in more general terms, and both "P+ type" and "P− type" can be referred to as "P type" in more general terms. Those skilled in the art should understand that the meanings of the terms identified above do not necessarily limit the terms, but merely provide illustrative examples for the terms.

Figure 3:
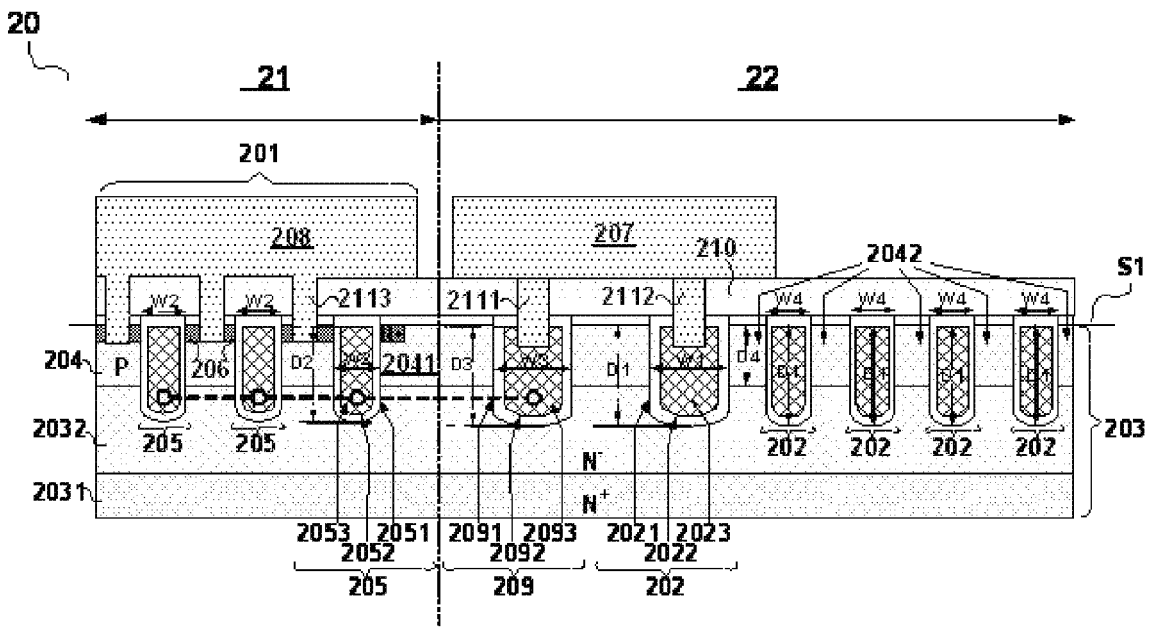
FIG. 3 illustrates schematically a cross-sectional view of a FET 20 in accordance with an embodiment of the present invention.
Figure 4:
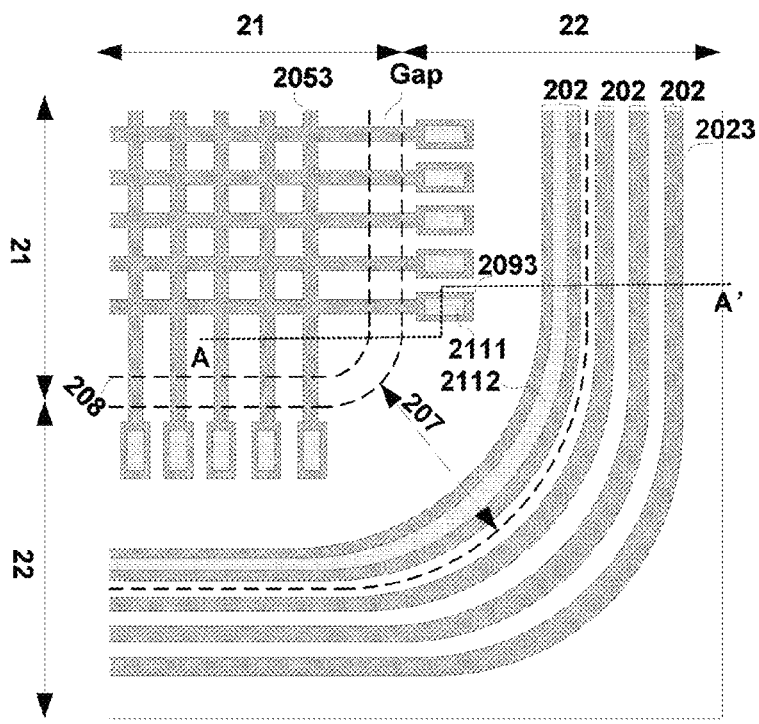
FIG. 4 illustrates schematically a top plan view of the FET 20 in accordance with an embodiment of the present invention.

FIG. 3 illustrates schematically a cross-sectional view of a FET 20 in accordance with an embodiment of the present invention. FIG. 4 illustrates schematically a top plan view of the FET 20 in accordance with an embodiment of the present invention. One having ordinary skill in the art should understand that the cross-sectional view in FIG. 3 and the top plan view in FIG. 4 illustrate actually portions of an entire die of the FET 20. For better understanding, it can be considered that the sectional view of FIG. 3 corresponds to the portion cut from the cut line AA' in the top plan view of FIG. 4. However, it should be understood that the corresponding relationship provided herein between the cross-sectional view and the top plan view of the FET 20 illustrated in FIG. 3 and FIG. 4 is not intended to be limiting.

In accordance with an exemplary embodiment of the present invention, the FET 20 is formed in a semiconductor layer 203 of a first conductivity type (e.g. illustrated as N type in FIG. 3). The semiconductor layer 203 may comprise a relatively heavy doped substrate layer 2031 (e.g. illustrated as an N+ substrate layer in FIG. 3) and a relatively light doped epitaxial layer 2032 (e.g. illustrated as an N− epitaxial layer in FIG. 3) formed on the substrate layer 2031. That is to say, the substrate layer 2031 has a larger dopant concentration than the epitaxial layer 2032. However, this is not intended to be limiting. The semiconductor layer 203 may comprise doped silicon (Si), Silicon-Germanium (SiGe), Silicon on insulator (SOI) and/or any other suitable semiconductor materials.

In accordance with an exemplary embodiment of the present invention, the semiconductor layer 203 may have an active cell area 21 and a termination area 22 located outside of the active cell area 21 (referring to the illustration in FIG. 3 and FIG. 4). It should be noted that in the embodiments illustrated in FIGS. 3 and 4, the boundaries, indicated with the vertical dotted line and double-head arrow lines, between the active cell area 21 and the termination area 22 are illustrative and approximate rather than limiting and absolute.

In accordance with an exemplary embodiment of the present invention, the FET 20 may comprise at least one active transistor cell 201 (in FIG. 3, a plurality of active transistor cells 201 are illustrated) formed in the active cell area 21, and a plurality of termination cells 202 formed in the termination area 22. It should be noted that the term "a plurality of" herein used is not intended to be exclusively limited to "more than one", but is intended to include "one". Each active transistor cell 201 may comprise a drain region (203), a gate region 205 and a source region 206. In the exemplary embodiment shown in FIG. 3, more than one active transistor cells 201 are illustrated out, and each active transistor cell 201 is exemplarily configured to be a vertical MOSFET cell, wherein the substrate layer 2031 of the semiconductor layer 203 may function as the drain region of each active transistor cell 201, and the epitaxial layer 2032 may function as a drift region of each active transistor cell 201. The source region 206 of each active transistor cell 201 is located laterally adjacent to both sides of the gate region 205, and may have the first conductivity type with a relatively heavy dopant concentration, e.g. heavier than the dopant concentration of the epitaxial layer 2032. For instance, in FIG. 3, the source region 206 is exemplarily illustrated as an N+ type doped region, and may have a dopant concentration higher than $1 \times 10^{19}$ cm$^{-3}$, while the N− type doped epitaxial layer 2032 may have a dopant concentration ranges from $1 \times 10^{14}$ cm$^{-3}$ to $1 \times 10^{17}$ cm$^{-3}$. However, one of ordinary skill in the art should understand that the dopant concentration ranges provided herein are just examples and are not intended to be limiting, any suitable dopant concentrations may be chosen according to practical design, fabrication and application requirements.

In the exemplary embodiment shown in FIG. 3, the gate regions 205 for the active transistor cells 201 are illustrated as trenched gate regions. Each of the trenched gate regions 205 may comprise a gate trench 2051 opened from the top surface S1 (represented by a dotted cut line in FIG. 3) of said semiconductor layer 203. The gate trench 2051 has sidewalls and a bottom, and may include a gate insulation layer 2052 lining the gate trench sidewalls and bottom, and a gate conduction layer 2053 filling the lined gate trench (i.e. the gate trench 2051 lined with the gate insulation layer 2052). The gate conduction layer 2053 is thus isolated from the semiconductor layer 203 by the gate insulation layer 2052. The gate trench 2051 of each of the gate regions 205 may have a trench width W2 and a trench depth D2. In the example of FIG. 3, the plurality of trenched gate regions 205 illustrated in sectional view are actually electrically connected with each other by transverse segments (illustrated in FIG. 3 by dotted line) of the trenched gate regions 205 having the same structure as those shown in the sectional view. Further referring to the top plan view of FIG. 4, the electrical connection of the trenched gate regions 205 may be better understood. It should be noted that in the top plan view of FIG. 4, only the gate conduction layer 2053 of the gate regions 205 is illustrated out for clarity and simplicity.

It should be noted that, in the present disclosure, the term "laterally" refers to a direction parallel to the cut line S1 of the top surface of the semiconductor layer 203. The term "width" refers to a distance measured laterally. The term "vertically" refers to a direction perpendicular to the top surface of the semiconductor layer 203. The term "depth" refers to a distance measured vertically.

In accordance with an exemplary embodiment of the present invention, the plurality of termination cells 202 are disposed in the semiconductor layer 203 in the termination area 22, and are arranged substantially in parallel from an inner side (close to the active cell area 21) toward an outer side (far away from the active cell area 21) of the termination area 22. In the example of FIG. 3, more than one (e.g. five) termination cells 202 are illustrated out. Each of the termination cells 202 may comprise a termination trench 2021 opened from the top surface S1 of said semiconductor layer 203. The termination trench 2021 has sidewalls and a bottom. The termination trench 2021 may include a termination insulation layer 2022 lining the termination trench sidewalls and bottom. The termination trench 2021 may further include a termination conductive layer 2023 filling the termination trench 2021 lined with the termination insulation layer 2022. The innermost termination cell 202 (the one closest to the active cell area 21) among the plurality of termination cells 202 is referred to as "the initial termination cell" or "the first termination cell", the rest of the termination cells 202 are successively referred to, according to their arrangement order from the inner side toward the outer side of the termination area 22, as "the second termination cell", "the third termination cell", "the fourth termination cell", "the fifth termination cell", and so forth. Although five termination cells 202 are illustrated in FIG. 3, it is obvious to one of ordinary skill in the art that this is only illustrative and not intended to be limiting. On the contrary, any reasonable number of termination cells 202 may be formed according to design and application requirements. The terms "inner" and "outer" herein used can respectively be considered as "closer" and "further" to the active cell area 21 in location. The terms "first", "second", "third", "fourth" and "fifth" are used only to differentiate the termination cells 202 from each other according to their distance to the inner side edge of the termination area 22 from near to far, rather than to specify their fabricating order or to add other limitations. The arrangement of the termination cells 202 may be better understood when read in conjunction with the top plan view illustrated in FIG. 4. It should be noted that the conductive layers 2023 are illustrated out in FIG. 4 while other elements of the termination cells 202 are omitted for clarity and simplicity.

The termination trench 2021 of each of the termination cells 202 may have a trench width and a trench depth. The trench width W1 of the initial/first termination cell 202 may be greater than the trench width W4 of each of the rest termination cells 202. The trench depth D1 of each termination trench 2021 may be substantially the same. In accordance with an embodiment of the present invention, the initial termination cell 202 is electrically coupled to the gate regions 205. One of ordinary skill in the art should understand that the electrical coupling between the initial termination cell 202 and the gate regions 205 is not limited to direct contact/connection, rather the electrical coupling may be implemented through various connection structures (e.g. through interlayer vias 2112 and gate electrode/gate metal 207 in FIG. 3). The greater trench width W1 may facilitate formation of the interlayer vias 2112 and ease the implementation of electrical coupling/connection of the initial termination cell 202 to the gate electrode/gate metal 207. The trench width W1 of the initial termination cell 202 may also be greater than the trench width W2 of each gate trench 2051 (W1>W2). The trench depth D1 of each termination trench 2021 may be the same as or different from the trench depth D2 of the gate trenches 205.

In accordance with an exemplary embodiment of the present invention, still referring to FIG. 3, the FET 20 may further comprise a body region 204 formed in the semiconductor layer 203 and near the top surface S1 of the semiconductor layer 203. The body region 204 has the second conductivity type and is illustrated as a P type doped region in the example of FIG. 3. The body region 204 has a body depth D4 from the top surface S1 into the epitaxial layer 2032. The body region 204 is relatively lightly doped compared to the source regions 206.

In an exemplary embodiment, the initial termination cell 202 divides the body region 204 into an active body region 2041 and a floating body region 2042, i.e. the initial termination cell 202 isolates the active body region 2041 from the floating body region 2042. The active body region operates as body region of each transistor cell 201. The source regions 206 are located in the active body region 2041. The floating body region 2042 is not intended to couple any established potentials, but is electrically floating and have a floating potential.

In an exemplary embodiment, as shown in FIG. 3, the body depth D4 is smaller/shallower than both of the trench depth D1 of the termination trenches 2021 and the trench depth D2 of the gate trenches 2051. The body region 204 is thus separated by the plurality of trenched gate regions 205 into a plurality of active body regions 2041 located in the active cell area 21 and is further separated by the plurality of termination trenches 2021 into a plurality of floating body regions 2042 located in the termination area 22. Therefore, in this exemplary embodiment as illustrated in FIG. 3, for each of the active transistor cells 201 in the active cell area 21, the source region 206 is formed in a corresponding active body region 2042 near the top surface S1. In the termination area 22, the plurality of termination cells 202 are disposed interleaving with the plurality of floating body regions 2042.

In accordance with an exemplary embodiment of the present invention, the FET 20 may further comprise a source electrode 208, a gate electrode 207 and a drain electrode (not shown in FIG. 3). In FIG. 3, the source electrode 208 is exemplarily illustrated as to comprise a source metal 208 formed above the active cell area 21. The gate electrode 207 is exemplarily illustrated as to comprise a source metal 207 formed above the termination area 22. In an embodiment, the gate metal 207 is substantially surrounding the outside of the source metal 208 and is separated from the source metal 208 with a gap. For better understanding, the source metal 208 and gate metal 207 are also illustrated out in the top plan view illustration of FIG. 4 with their outlines represented by dotted lines. In an embodiment, the active body regions 2041 and the source regions 206 of the active transistor cells 201 are electrically coupled to the source electrode (e.g. the source metal 208 illustrated in FIG. 3) of the FET 20. The gate regions 205 are electrically coupled to the gate electrode (e.g. the gate metal 207 illustrated in FIG. 3). The floating body regions 2042 are not intended to couple any established potentials (e.g. the floating body regions 2042 are not coupled to any of the source electrode/source metal 208, gate electrode/gate metal 207 and drain electrode of the FET 20), but are electrically floating and have floating potentials. In accordance with an exemplary embodiment of the present invention, the FET 20 may further comprise at least one gate runner 209 disposed in the termination area 22 of the semiconductor layer 203 to connect the gate regions 205 to the gate metal 207. In the example of FIG. 3, the gate runner 209 is located more inner than the of the initial termination cell 202. That is to say, the gate runner 209 is closer to the active cell area 21 or the active transistor cells 201 than the initial termination cell 202. The gate runner 209 is provided to facilitate the implementation of electrical coupling/connection of the gate regions 205 to the gate electrode/gate metal 207. In one embodiment, the gate runner 209 comprises a runner trench 2091 opened from the top surface S1 of said semiconductor layer 203. The runner trench 2091 has sidewalls and a bottom, and includes a runner insulation layer 2092 lining the runner trench sidewalls and bottom. The runner trench 2091 further includes a runner conduction layer 2093 filling the lined runner trench (i.e. the runner trench 2091 lined with the runner insulation layer 2092). The runner conduction layer 2093 is thus isolated from the semiconductor layer 203 and the body region 204 (i.e. the active body region 2041) by the runner insulation layer 2092. In accordance with an exemplary embodiment of the present invention, the gate regions 205 are electrically coupled to the at least one gate runner 209. For instance, in the example illustrated in FIG. 3 where the gate regions 205 are configured as trenched gate regions, the gate trenches 2051 are connected to the runner trench 2091 by a transverse segment (illustrated in FIG. 3 by dotted line) of either the gate trenches 2051 or the gate runner trench 2091 such that the gate conduction layer 2053 of the trenched gate regions 205 is connected to the runner conduction layer 2093. In one embodiment, the runner trench 2091 may have a trench width W3 and a trench depth D3, wherein the runner trench width W3 is greater than the gate trench width W2. Therefore, the runner conduction layer 2093 can provide larger contactable area for forming connection(s) (e.g. the via 2111 illustrated in FIG. 3) to the gate electrode 207 and thus facilitate the electrical coupling of the gate regions 205 to the gate electrode 207. This can be better understood when read in conjunction with the top plan view illustrated in FIG. 4. It should be noted that in the top plan view of FIG. 4, the gate conduction layer 2053, the runner conduction layer 2093 and the via 2111 are illustrated out while other elements of the gate structures (e.g. the gate structures may refer to the gate regions 205, the at least one gate runner 209 and the gate metal 207) are omitted for clarity and simplicity. In the example of FIG. 4, more than one gate runners 209 are illustrated. One having ordinary skill in the art should understand that the structures and connections of the gate regions 205 and the trenched gate runner 209 shown in FIGS. 3 and 4 are only for purpose of illustration. Actually, the structures, arrangements, and connection relationships of the gate regions 205 and the gate runners 209 are not limited to that described above with reference to FIGS. 3 and 4.

Although in the example of FIG. 3, the trench depth D1 of the termination trench 2021, the trench depth D2 of the gate trench 2051 and the trench depth of the runner trench 2091 are illustrated to be substantially the same, in other embodiment the depth D1, D2 and D3 may not match with each other. In accordance with an exemplary embodiment of the present invention, the gate insulation layer 2052, the runner insulation layer 2092 and the termination insulation layer 2022 may comprise a same dielectric material such as silicon dioxide. In other embodiments, the gate insulation layer 2052, the runner insulation layer 2092 and the termination insulation layer 2022 may comprise different dielectric materials. The gate conduction layer 2053, the runner conduction layer 2093 and the termination conduction layer 2023 may comprise a same conduction material such as doped polysilicon. In other embodiments, the gate conduction layer 2053, the runner conduction layer 2093 and the termination conduction layer 2023 may comprise different conduction materials other than polysilicon that are compatible with other aspects of the device manufacturing process. Thus, the term "poly-silicon" is intended to include such other conductive or semi-conductive materials and combinations thereof in addition to silicon.

In accordance with an exemplary embodiment of the present invention, the FET 20 may further comprise an interlayer dielectric ("ILD") layer 210 that is disposed between the metal layer (e.g. including the source metal 208 and gate metal 207) and the semiconductor layer 203 to prevent the source metal 208 being undesirably shorted to the gate regions 205 and/or the gate metal 207 being undesirably shorted to the source regions 206. In accordance with an embodiment of the present invention, the gate metal 207 is electrically coupled to the at least one gate runner 209 through a plurality of first type vias 2111 formed in the ILD layer 210, e.g. the gate metal 207 extends through the vias 2111 to contact the runner conduction layer 2093 of the gate runner 209 so that the gate metal 207 is coupled to the gate regions 205 through the gate runner 209. The gate metal 207 can be further electrically coupled to the initial termination cell 202 through a plurality of second type vias 2112 formed in the ILD layer 210, e.g. the gate metal 207 extends through the vias 2112 to contact the termination conduction layer 2023 so that the initial termination cell 202 is coupled to the gate regions 205. Similarly, the source metal 208 is electrically coupled to the source regions 206 through a plurality of third type vias 2113 formed in the ILD layer 210, e.g. the source metal 208 extends through the vias 2113 to contact the source regions 206 and the active body regions 2041. One having ordinary skill in the art should understand that the term "plurality of" herein is not exclusively limited to more than one, but is intended to include one.

Figure 1:
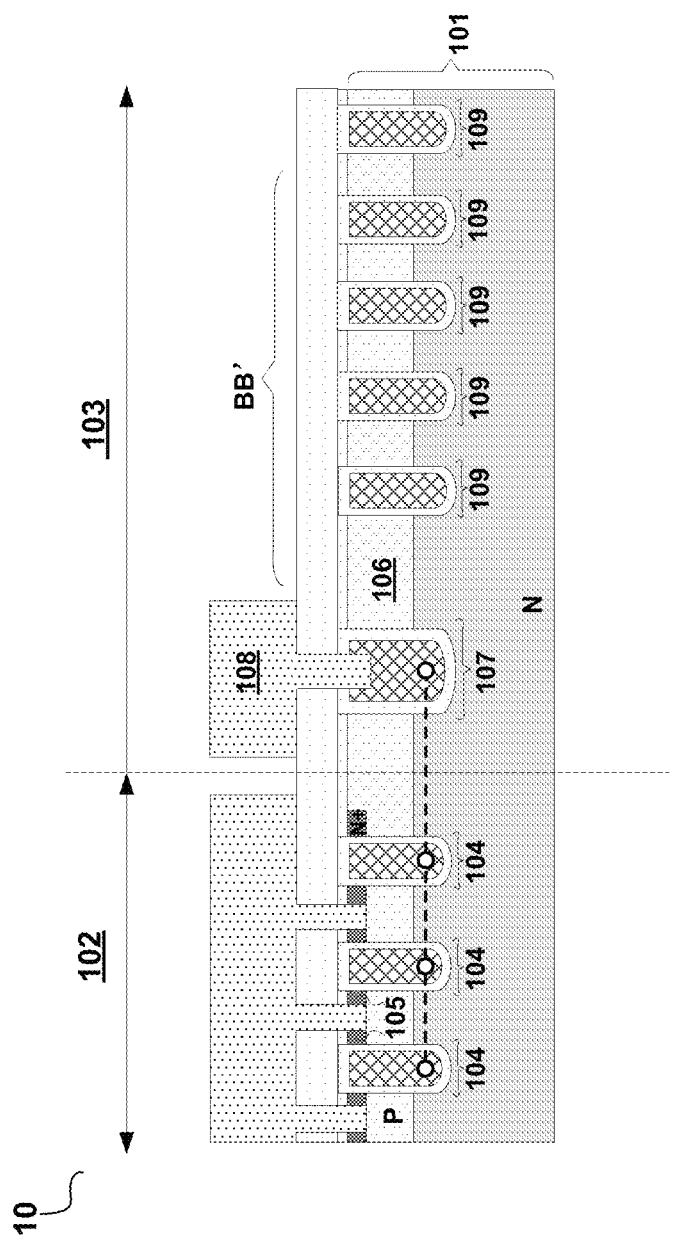
FIG. 1 illustrates schematically a cross-sectional view of an existing trench gate FET 10 having trenched isolation cells.
Figure 2:
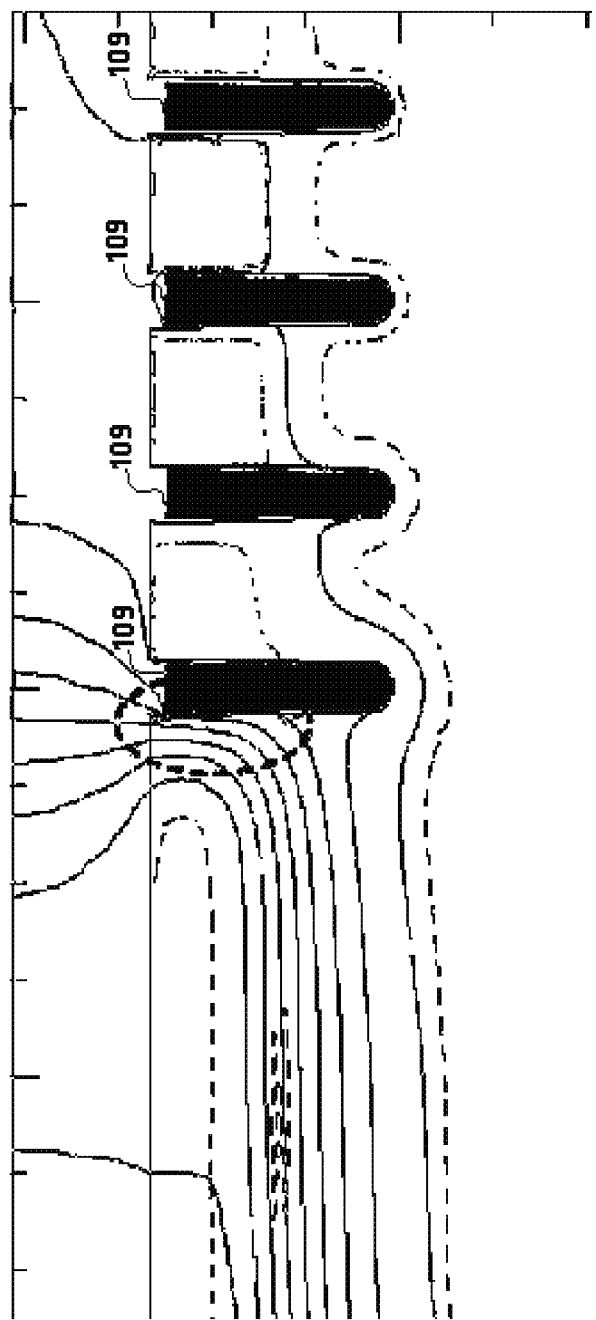
FIG. 2 illustrates a simulated equal potential line distribution diagram of a portion of the trenched isolation cells 109 in the FET 10.

In accordance with the various embodiments of the present invention described above with reference to FIGS. 3 and 4, the termination cells 202 of the FET 20 can help to block undesired electrical current/carries leakage path from the termination area 22 to the active cell area 21, thereby shielding the active transistor cells 201 from being affected by the undesired carriers. Compared with the FET 10 of FIG. 1, when the FET 20 is off and a high drain to source voltage (e.g. 30V) is applied between the drain region 203 and the source region 206, the high drain to source voltage drops among the plurality of the termination cells 202. Since the initial termination cell 202 is electrically coupled to the gate region 205, which in this circumstance is generally coupled to ground potential, the electric field intensity near the sidewalls of the initial termination cell 202 may be effectively reduced. Therefore, the initial termination cell 202 is less likely to be damaged and the breakdown voltage of the FET 20 can be improved with its ruggedness and lifetime increased.

Figure 5:
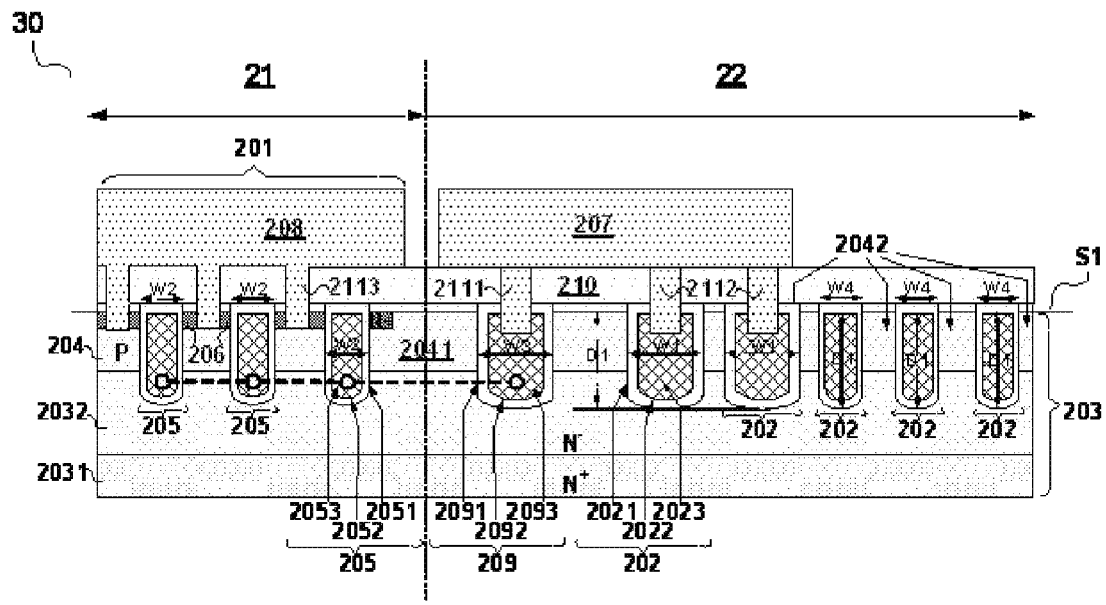
FIG. 5 illustrates schematically a cross-sectional view of a FET 30 in accordance with an embodiment of the present invention.

FIG. 5 illustrates schematically a cross-sectional view of a FET 30 in accordance with an embodiment of the present invention. Components or structures in the FET 30 with substantially the same functions as those of the FET 20 are identified by the same reference labels for the sake of simplicity. In the exemplary embodiment of FIG. 5, the second termination cell 202 is also electrically coupled to the gate region 205 of the transistor cell 201. In accordance with the example of FIG. 5, the second termination cell 202 can be connected to the gate metal 207 via another plurality of second type vias 2112 formed in the ILD layer 210. Similar as the initial termination cell 202, the second termination cell 202 has a greater trench width (W1) than the trench width W4 of each of the rest termination cells 202. Although the second termination cell 202 is illustrated to have a substantially same trench width W1 as the initial termination cell 202, it can have different trench width from the initial termination cell 202 in other embodiment. When the FET 30 is off and a high drain to source voltage (e.g. 30V) is applied between the drain region 203 and the source region 206, the high drain to source voltage drops among the plurality of the termination cells 202. Since both the initial termination cell 202 and the second termination cell 202 are electrically coupled to the gate region 205, which in this circumstance is generally coupled to ground potential, the initial and the second termination cells 202 can sustain and share the voltage dropped on them together, and thus the electric field intensity near the sidewalls and bottom of the initial and the second termination cells 202 may be further reduced. Therefore, the breakdown voltage of the FET 30 can be further increased with its ruggedness and lifetime improved.

Figure 6:
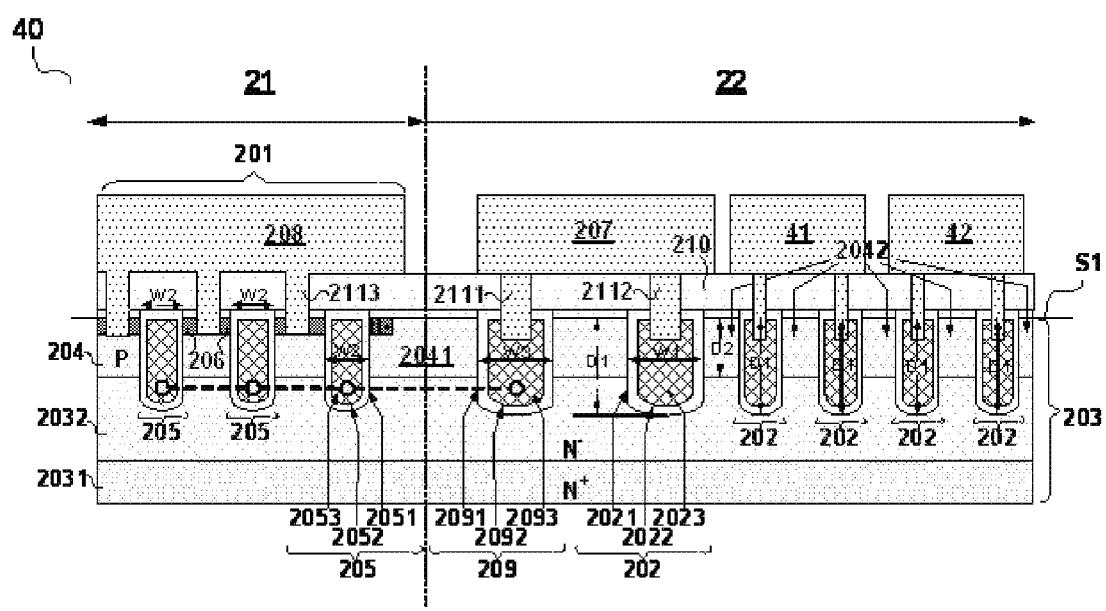
FIG. 6 illustrates schematically a cross-sectional view of a FET 40 in accordance with an embodiment of the present invention.

FIG. 6 illustrates schematically a cross-sectional view of a FET 40 in accordance with an embodiment of the present invention. Components or structures in the FET 40 with substantially the same functions as those of the FETs 20 and 30 are identified by the same reference labels for the sake of simplicity. With reference to FIG. 6, except the initial termination cell 202, the rest of the termination cells 202 may be grouped two by two (i.e. in pairs) with the two termination cells 202 in each group being electrically coupled together. In this way, a plurality of termination cell groups is formed. In accordance with an embodiment of the present invention, each of the termination cell groups is not intended to couple any established potential and is thus electrically floating and has a floating potential. In the example of FIG. 6, the second termination cell 202 and the third termination cell 202 are electrically coupled together to form a first floating termination cell group, the fourth termination cell 202 and the fifth termination cell 202 are electrically coupled together to form a second floating termination cell group. In each of the floating termination cell groups, the termination cells 202 can be electrically coupled to each other through coupling to a metal layer, e.g. in FIG. 5, the second and the third termination cells 202 are coupled to a metal layer 41, the fourth and the fifth termination cells 202 are coupled to a metal layer 42. When the FET 40 of FIG. 6 is off and a high drain to source voltage (e.g. 30V) is applied between the drain region 203 and the source region 206, the high drain to source voltage drops among the plurality of the termination cells 202. Since the first floating termination cell group (the second termination cell 202 and the third termination cell 202) forms an electrically coupled unity, the electrical field strength can be relatively evenly distributed near the second and the third termination cells 202. Likewise, the second floating termination cell group (the fourth termination cell 202 and the fifth termination cell 202) forms an electrically coupled unity, thus the electrical field strength can be relatively evenly distributed near the fourth and the fifth termination cells 202. Therefore, the electric field distribution near the plurality of termination cells 202 is gradually changed in units of area that are defined by the floating termination cell groups, reducing the change gradient of the electric field intensity. In consequence, the plurality of termination cells 202 are less vulnerable, and the breakdown voltage of the FET 40 can be further increased with its ruggedness and lifetime improved.

Although the embodiment of FIG. 6 illustrates that the termination cells 202 (except the initial termination cell 202) are grouped into floating termination cell groups in pairs, this is not intended to be limiting. One of ordinary skill in the art should understand that the number and location of the termination cells 202 in each of the floating termination cell groups can be varied according to practical application requirements. For instance, in an embodiment, supposing seven termination cells 202 are formed, except the initial termination cell 202, the rest six termination cells 202 can be grouped three by three (i.e. in trios) into two termination cell groups, wherein the three termination cells in each of the two termination cell groups are electrically coupled together but are not intended to couple any established potential (i.e. electrically floating). In an alternative embodiment, still supposing seven termination cells 202 are formed, except the initial termination cell 202, the rest six termination cells 202 can be grouped successively in three, in two and in one so that three termination cell groups (i.e. a first termination cell group of three, a second termination cell group of two and a third termination cell group of one) are formed. In each termination cell group, the termination cell members 202 are electrically coupled together but are electrically floating, i.e. the three termination cells 202 in the first termination cell group are electrically coupled together and are electrically floating, the two termination cells 202 in the second termination cell group are electrically coupled together and are electrically floating, and the one termination cell 202 in the third termination cell is alone and electrically floating.

In accordance with an alternative embodiment of the present invention, the connection and grouping of the plurality of termination cells 202 can be varied based on both the embodiments of FIG. 5 and FIG. 6 to further improve performance of the FET. For instance, in an embodiment, among the plurality of termination cells 202, the initial termination cell 202 and the second termination cell 202 are electrically coupled to the gate metal 207 so that they are electrically coupled to the gate regions 205 of the transistor cells 201. As for the rest of the termination cells 202, they can be grouped in to a plurality of floating termination cell groups in the similar fashions as described above.

Figure 7:
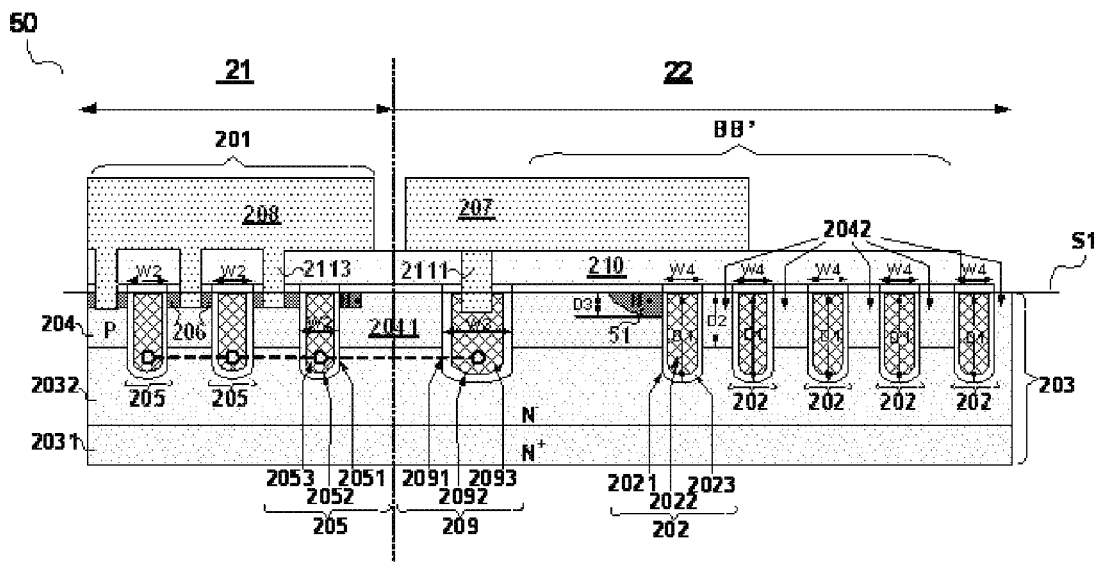
FIG. 7 illustrates schematically a cross-sectional view of a FET 50 in accordance with an embodiment of the present invention.

FIG. 7 illustrates schematically a cross-sectional view of a FET 50 in accordance with an embodiment of the present invention. Components or structures in the FET 50 with substantially the same functions as those of the FETs 20, 30 and 40 are identified by the same reference labels for the sake of simplicity. The FET 50 may further comprise at least one reduced surface field (RESURF) region 51, which is formed in the termination area 22 and located more inner than the initial termination cell 202. That is to say, the RESURF region 51 is closer to the active cell area 21 or the active transistor cells 201 than the initial termination cell 202. For instance, in FIG. 7, the RESURF region 51 is positioned on the left side of the initial termination cell 202 and on the right side of the gate runner 209. In accordance with an embodiment of the present invention, the at least one RESURF region 51 has a conductivity type opposite to that (D4) of the floating body regions 2042, and has a depth D5 shallower than that of the floating body regions 2042, i.e. D5<D4.

Figure 8:
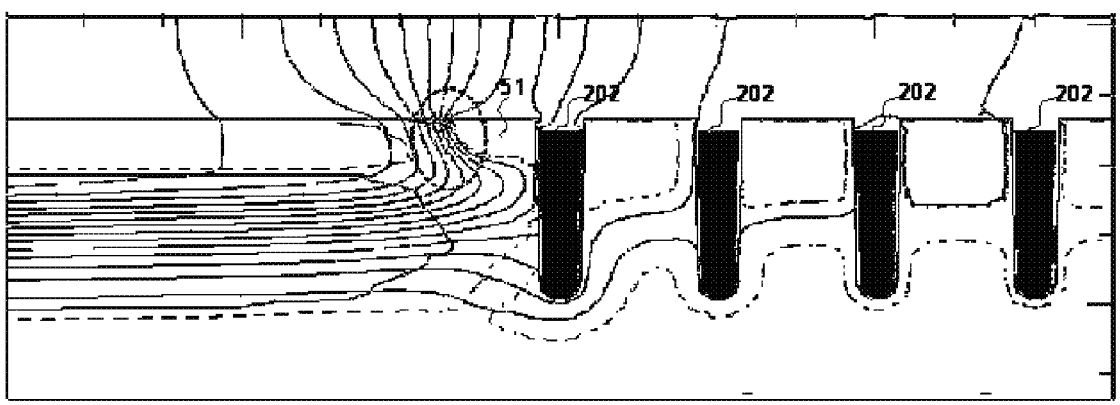
FIG. 8 illustrates a simulated equal potential line distribution diagram of a portion of the FET 50 when the FET 50 is OFF and a high drain to source voltage is applied.

In the example of FIG. 7, the at least one RESURF region 51 comprises one RESURF region 51 and is formed abutting the left sidewall (an inner sidewall) of the termination trench 2021 of the initial termination cell 202. FIG. 8 illustrates a simulated equal potential line distribution diagram of a portion of the FET 50 (e.g. a portion corresponding to the BB' area in FIG. 7) when the FET 50 is OFF and a high drain to source voltage (e.g. 30V) is applied between the drain region 203 and the source region 206. It can be seen from FIG. 8 that the RESURF region 51 pushes the relatively intensive equal potential lines (e.g. the portion looped by the dotted ellipse) away from the left side of the initial termination cell 202 and can deplete the body region 204 around the RESURF region 51. Therefore, the electric field intensity near the left side of the termination trench 2021 of the initial termination cell 202 is further suppressed, decreasing the possibility of the termination insulation layer 2022 being punched through. In the meanwhile, the breakdown voltage of FET 50 may be improved and walk-out/deviation in the breakdown voltage may be eliminated or at least suppressed. The ruggedness and lifetime of the FET 50 are consequently improved.

In the example of FIG. 7, the initial termination cell 202 is no longer coupled to the gate regions 205 of the transistor cells 201, i.e. it is no longer connected to the gate metal 207 and the gate runner 209, but is not intended to couple any established potentials (i.e. it is electrically floating and has a floating potential) just as the rest of the termination cells 202. Referring to FIG. 7, the initial termination cell 202 and the rest of the termination cells 202 may of a same size. However, this is not intended to be limiting, the initial termination cell 202 can certainly have different size from those of the rest of the termination cells 202. In an alternative embodiment, the initial termination cell 202 may not be electrically floating and can still be coupled to the gate regions 205 in the similar fashions as described with reference to FIGS. 3-6.

In accordance with an embodiment of the present invention, still referring to FIG. 7, the plurality of termination cells 202 can be regrouped/divided into a plurality of termination cell groups (similarly as illustrated in FIG. 6), wherein each of the termination cell group comprises a predetermined number of termination cells 202 selected among the plurality of termination cells 202, and wherein the termination cells 202 within each termination cell group are electrically coupled together and have a floating potential.

Figure 9:
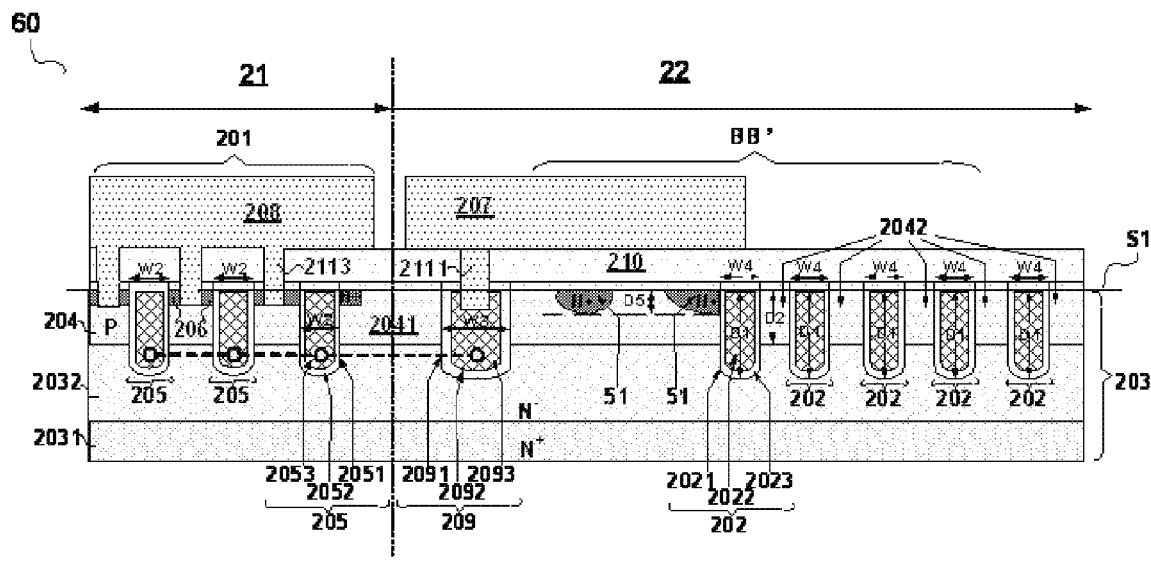
FIG. 9 illustrates schematically a cross-sectional view of a FET 60 in accordance with an embodiment of the present invention.

FIG. 9 illustrates schematically a cross-sectional view of a FET 60 in accordance with an embodiment of the present invention. Components or structures in the FET 60 with substantially the same functions as those of the FETs 20, 30, 40 and 50 are identified by the same reference labels for the sake of simplicity. In the FET 60, the difference from FET 50 is that the at least one RESURF region 51 comprises a plurality of such RESURF regions 51, wherein the plurality of the RESURF regions 51 are separated from each other. For instance, in FIG. 9, two such RESURF regions 51 are illustrated, which are separated from each other and are positioned between the left side of the initial termination cell 202 and the right side of the gate runner 209. However, one of ordinary skill in the art should understand that this is just for illustrative purpose and is not intended to be limiting. The number of the RESURF regions 51 may be varied and defined according to practical needs.

Figure 10:
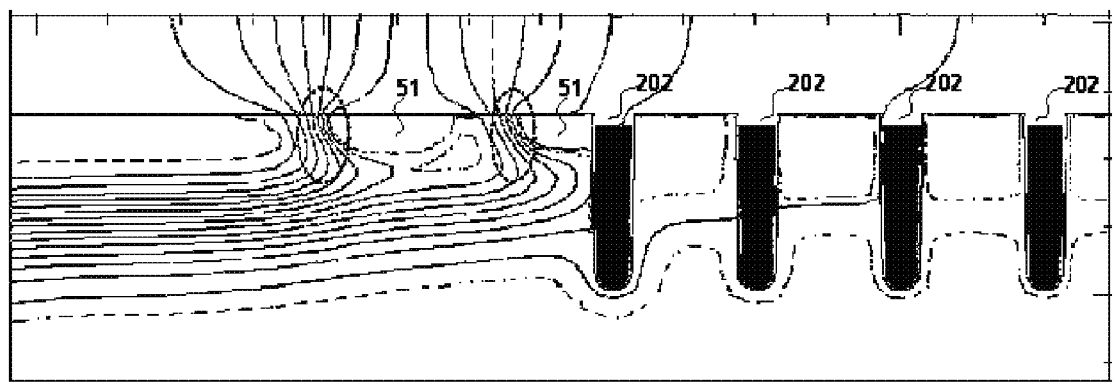
FIG. 10 illustrates a simulated equal potential line distribution diagram of a portion of the FET 60 when the FET 60 is OFF and a high drain to source voltage is applied.

FIG. 10 illustrates a simulated equal potential line distribution diagram of a portion of the FET 60 (e.g. a portion corresponding to the BB' area in FIG. 9) when the FET 60 is OFF and a high drain to source voltage (e.g. 30V) is applied between the drain region 203 and the source region 206. It can be seen from FIG. 10 that the plurality of RESURF regions 51 pushes the relatively intensive equal potential lines (e.g. the portion looped by the dotted ellipse) away from the left side of the initial termination cell 202. Moreover, the plurality of RESURF regions 51 can share the electric field strength substantially evenly, thus can reduce the electric field strength suffered by the PN junction between the RESURF regions 51 and the body region 204. In addition, the RESURF regions 51 can deplete the body region 204 around them, which beneficially further reduces the electric field intensity near these RESURF regions and the initial termination cell 202. Therefore, the termination structure (including the termination cells 202 and the RESURF regions 51) can further increase the high-voltage sustaining capability of the FET 60. In the meanwhile, the breakdown voltage of FET 60 is improved and walk-out/deviation in the breakdown voltage may be eliminated or at least suppressed. The ruggedness and lifetime of the FET 60 are consequently improved further.

One of ordinary skill in the art should understand that the FET 60 illustrated in FIG. 9 is only illustrative but not limiting. Various modifications can be made without deviating from the spirit and scope of the invention. For instance, the initial termination cell 202 of FET 60 can be coupled to the gate electrode 207/the gate regions 205, similarly as illustrated in FIGS. 3-6. The plurality of termination cells 202 can also be regrouped/divided into a plurality of termination cell groups (similarly as illustrated in FIG. 6), wherein each of the termination cell group comprises a predetermined number of termination cells 202 selected among the plurality of termination cells 202, and wherein the termination cells 202 within each termination cell group are electrically coupled together and have a floating potential.

Figure 11:
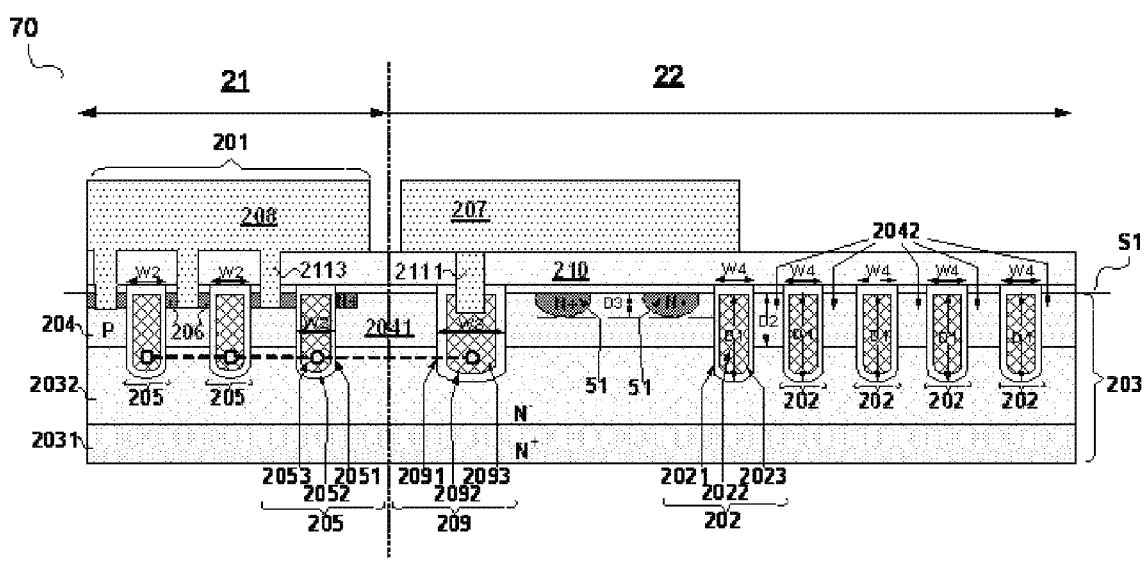
FIG. 11 illustrates schematically a cross-sectional view of a FET 70 in accordance with an embodiment of the present invention.

FIG. 11 illustrates schematically a cross-sectional view of a FET 70 in accordance with an embodiment of the present invention. Components or structures in the FET 60 with substantially the same functions as those of the FETs 20, 30, 40, 50 and 60 are identified by the same reference labels for the sake of simplicity. In the FET 70, the difference from FET 60 is that the RESURF region 51 closest to the initial termination cell 202 is separated from the left sidewall of the termination trench 2021 of the initial termination cell 202. In this circumstance, the RESURF region 51 closest to the initial termination cell 202 can help to prevent/at least reduce the formation of a conduction channel along the left sidewall of the termination trench 2021 of the initial termination cell 202 due to capacitive coupling. Therefore, the termination structure of the FET 70 has better isolation and voltage sustaining performance and improved robustness. In certain applications, the termination structure shown in FIG. 11 can be quite useful. For instance, if the FET 70 is required to have a relatively low turn-on threshold while a high breakdown voltage is also a must, then using the termination structure in FIG. 11 can be a good choice to meet the requirements and protect the FET 70 from being damaged.

Although the present disclosure takes the example of an N-channel FET (such as FET 20, 30, 40, 50, 60 or 70) comprising an N-channel trenched gate vertical MOSFET (such as MOSFET 201) and a termination structure (e.g. including the gate runner 209, the termination cells 202, the RESURF regions 51) to illustrate and explain the structures of a FET having a termination structure according to various embodiments of the present invention, this is not intended to be limiting. Persons of skill in the art will understand that the structures and principles taught herein also apply to other types of semiconductor materials and devices as well, for example, the FETs 20, 30, 40, 50, 60 and 70 may be P-channel FETs. In other alternative embodiments, the MOSFET 201 may be a DMOS transistor or a JFET etc. The MOSFET 201 is not limited to vertical transistor and trenched gate transistor described, but can be a lateral transistor or a planar gate transistor instead.

The advantages of the various embodiments of the FET having the termination structure of the present invention are not confined to those described above. These and other advantages of the various embodiments of the present invention will become more apparent upon reading the whole detailed descriptions and studying the various figures of the drawings.

Figure 12:
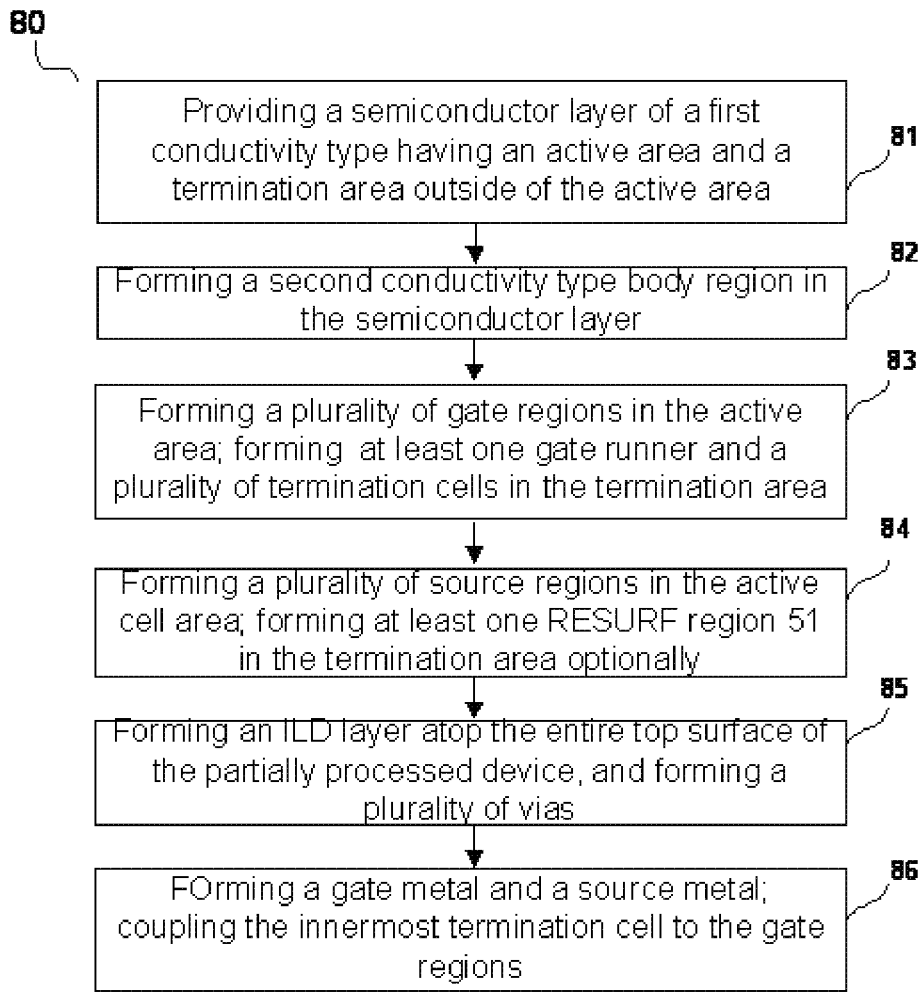
FIG. 12 illustrates a process flow 80 of a method for forming a FET having a termination structure in accordance with an embodiment of the present invention.

FIG. 12 illustrates a process flow 80 of a method for forming a FET having a termination structure (e.g. the termination structure including the termination cells 202) in accordance with an exemplary embodiment of the present invention. The method may comprise:

Step 81, providing an initial semiconductor layer 203 having a first conductivity type (e.g. illustrated as N type in FIGS. 3-11). In accordance with an embodiment, the semiconductor layer 203 may comprise a relatively heavy doped substrate layer 2031 (e.g. illustrated as an $N^+$ substrate layer in FIGS. 3-11) and a relatively light doped epitaxial layer 2032 (e.g. illustrated as an $N^-$ epitaxial layer in FIG. 3-11) formed on the substrate layer 2031. The semiconductor layer 203 may be divided into an active cell area 21 and a termination area 22 (also referring to the top plan view illustration in FIG. 4) that are respectively designated for forming active transistor cells 201 of the FET and termination cells 202 of the termination structure.

Step 82, forming a second conductivity type body region 204 in the semiconductor layer 203, wherein the second conductivity type is opposite to the first conductivity type. In an embodiment, the body region 204 can be formed through second conductivity type dopant implantation from the top surface of the semiconductor layer 203. Then diffusion or driving process is applied. The body region 204 may have a depth D4.

Step 83, forming a plurality of gate regions 205 in the active cell area 21 for the active transistor cells 201. In accordance with an exemplary embodiment of the present invention, forming the gate regions 205 may comprise: forming a plurality of gate trenches 2051 in the active cell area 21; forming a gate insulation layer 2052 (e.g. silicon dioxide) lining the sidewalls and bottom of the gate trenches 2051; and forming a gate conduction layer 2053 to fill the gate trenches 2051.

In accordance with an embodiment of the present invention, at the step 83, at least one gate runner 209 and a plurality of termination cells 202 can be formed in the termination area 22 at the same time when the gate regions 205 are formed to save manufacturing steps and costs. For instance, at least one gate runner trench 2091 for the gate runner 209 and a plurality of termination trenches 2021 for the plurality of termination cells 202 can be formed in the termination area 22 at the same time when the gate trenches 2051 are formed. Subsequently, the at least one gate runner is lined with a runner insulation layer 2092 and filled with a runner conduction layer 2093, the plurality of termination trenches are lined with a termination insulation layer 2022 and filled with a termination conduction layer 2023. In an embodiment, the runner insulation layer 2092 and the termination insulation layer 2022 can be formed with at the same time when the gate insulation layer 2052 is formed. The runner conduction layer 2093 and the termination conduction layer 2023 can be formed at the same time when the gate conduction layer 2053 is formed. However, this is not intended to be limiting, one of ordinary skill in the art should understand that the gate regions 205, the gate runner 209 and the termination cells 202 may not be formed at the same time/in the same step in other embodiments. In accordance with an embodiment, the termination cells 202 are arranged substantially in parallel from an inner side (close to the active cell area 21) toward an outer side (far away from the active cell area 21) of the termination area 22. The termination cell 202 which is closest to the active cell area 21 is referred to as the initial termination cell 202.

In one embodiment, each of the termination trenches 2021 may have a trench width and a trench depth (D1), wherein the termination trench 2021 which is closest to the active cell area 21 (i.e. the initial termination trench) has a first trench width W1 and each of the rest termination trenches 2021 has a second trench width W4, and wherein the first trench width W1 is greater than the fourth trench width W4, i.e. W1>W4. Each of the gate trenches 2051 may have a trench width W2 and a trench depth D2. The at least one runner trench 2091 may have a trench width W3 and a trench depth D3. In one embodiment, the trench width W3 of the runner trench 2091 is greater than that (W2) of the gate trenches 2051, i.e. W3>W2. In one embodiment, the trench width W1 of the termination trenches 2021 may be greater than that (W2) of the gate trenches 2051 i.e. W1>W2. In one embodiment, the termination trenches 2021, the gate trenches 2051, and the runner trench 2091 may share a substantially same trench depth as illustrated in the example of FIGS. 3-11, i.e. D1≈D2≈D3. In other embodiment, the depths D1, D2 and D3 may not match with each other.

In an alternative embodiment, the step 83 may be performed prior to the step 82.

Step 84, forming a plurality of source regions 206 in the active cell area 21 so that the source regions 206 are located at both sides of each of the gate regions 205. The source regions 206 may be formed through first conductivity type dopant implantation from the top surface of the semiconductor layer 203.

Step 85, forming an ILD layer 210 atop the entire top surface of the partially processed device, and forming a plurality of first type vias 2111, a plurality of second type vias 2112 and a plurality of third type vias 2113 in the ILD layer, wherein the first type vias 2111 are over the gate runner 209, the second type vias 2112 are over the initial termination cell 202 and the third type vias 2113 are over the source regions 206.

Step 86, forming a gate metal 207 and a source metal 208 respectively over the termination area 22 and the active cell area 21 atop the ILD layer 210, wherein the gate metal 207 and the source metal 208 are separated with a gap. The gate metal 207 is electrically coupled to the gate runner 209 and thus to the gate regions 205 through the plurality of first type vias 2111, the source metal 208 is electrically coupled to the source regions 206 through the plurality of third type vias 2113. In one embodiment, the gate metal 207 is further electrically coupled to the initial termination cell 202 through the plurality of second type vias 2112 so that the initial termination cell 202 is coupled to the gate regions 205.

In accordance with an alternative embodiment of the present invention, the step 84 further includes forming at least one RESURF region 51 in the termination area 22 between the gate runner 209 and the initial termination cell 202. The RESURF region 51 may have a depth D5 which is shallower than that (D4) of the body region 204, i.e. D5<D4. The RESURF region 51 closest to the initial termination cell 202 can be abut or separate from the left sidewall of the initial termination cell 202.

In accordance with an alternative embodiment of the present invention, the step 85 may further includes forming a plurality of fourth type vias in the ILD layer 210 over the plurality of termination cells 202 so that the fourth type vias can be used to couple the plurality of termination cells 202 into a plurality of termination cell groups. In this case, in the step 86, a plurality of termination metals are formed corresponding to the plurality of termination cell groups, wherein each termination metal is used to electrically couple the termination cells within a corresponding termination cell group together.

Methods and processes of forming a FET having a termination structure described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the invention is not limited except as by the appended claims.

We claim:

1. A field effect transistor, comprising:
a semiconductor layer of a first conductivity type, wherein the semiconductor layer has an active area and a termination area outside of the active area;
a plurality of active transistor cells formed in the semiconductor layer in said active area, wherein each of the transistor cells comprises a drain region of the first conductivity type, a source region of the first conductivity type, an active body region of a second conductivity type and a gate region, and wherein the source region is located in the active body region and laterally adjacent to both sides of the gate region;
a plurality of floating body regions of the second conductivity type disposed in the semiconductor layer in said termination area; and
a plurality of termination cells disposed interleaving with the plurality of floating body regions in the termination area, and arranged substantially in parallel from an inner side toward an outer side of the termination area; wherein
each of the termination cells comprises a termination trench opened from a top surface of said semiconductor layer and having sidewalls and a bottom, wherein the termination trench includes a termination insulation layer lining the termination trench sidewalls and bottom, and a termination conduction layer filling the termination trench; and wherein the innermost termination cell among the plurality of termination cells isolates the floating body regions from the active body regions so that the floating body regions have floating potentials; and wherein the innermost termination cell is electrically coupled to the gate regions of the transistor cells while the rest of the termination cells are electrically floating.

2. The field effect transistor of claim 1, wherein the gate region of each of the transistor cells comprises a gate trench opened from the top surface of said semiconductor layer and having sidewalls and a bottom, and wherein the gate trench includes a gate insulation layer lining the gate trench sidewalls and bottom, and a gate conduction layer filling the gate trench.

3. The field effect transistor of claim 2, further comprising at least one gate runner disposed in the semiconductor layer in said termination area, wherein the gate runner comprises a runner trench opened from the top surface of said semiconductor layer and having sidewalls and a bottom, wherein the runner trench includes a runner insulation layer lining the runner trench sidewalls and bottom, and a runner conduction layer filling the runner trench, and wherein the runner trench has greater trench width than the gate trench, and wherein the runner conduction layer is electrically coupled to the gate conduction layer of each of the transistor cells.

4. The field effect transistor of claim 3, wherein the termination trench of the innermost termination cell has greater trench width than the gate trench, and wherein the innermost termination cell is electrically coupled to the gate runner.

5. The field effect transistor of claim 3, further comprising:

an interlayer dielectric layer formed on the top surface of the semiconductor layer; and a gate metal formed on the interlayer dielectric layer, wherein the gate metal is electrically coupled to the gate runner through a plurality of first type vias in the interlayer dielectric layer, and wherein the gate metal is further electrically coupled to the innermost termination cell through a plurality of second type vias in the interlayer dielectric layer.

6. The field effect transistor of claim 1, wherein the second innermost termination cell is also electrically coupled to the gate regions.

7. The field effect transistor of claim 1, wherein the rest of the termination cells except the innermost termination cell are regrouped into a plurality of termination cell groups, wherein each of the termination cell group comprises a predetermined number of the termination cells selected among the rest of termination cells, and wherein the termination cells within each termination cell group are electrically coupled together and have a floating potential.

8. The field effect transistor of claim 1, further comprising at least one reduced surface field ("RESURF") region of the first conductivity type, wherein the at least one RESURF region is formed in the termination area and located more inner than the innermost termination cell, and wherein the at least one RESURF region has a depth smaller than a depth of the floating body regions.

9. The field effect transistor of claim 8, wherein the innermost termination cell is decoupled from the gate regions.

10. The field effect transistor of claim 8, wherein the at least one RESURF region comprises one RESURF region and is formed abutting an inner sidewall of the innermost termination cell.

11. The field effect transistor of claim 8, wherein the at least one RESURF region comprises a plurality of such RESURF regions, wherein the plurality of the RESURF regions are separated from each other.

12. A termination structure for a field effect transistor, wherein the field effect transistor comprises a semiconductor layer of a first conductivity type having an active area and a termination area outside of the active area, the termination structure comprising:

a plurality of floating body regions of a second conductivity type disposed in the semiconductor layer in said termination area; and a plurality of termination cells disposed interleaving with the plurality of floating body regions in the termination area, and arranged substantially in parallel from an inner side toward an outer side of the termination area; wherein each of the termination cells comprises a termination trench opened from a top surface of said semiconductor layer and having sidewalls and a bottom, wherein the termination trench includes a termination insulation layer lining the termination trench sidewalls and bottom, and a termination conduction layer filling the termination trench; and wherein the innermost termination cell among the plurality of termination cells isolates the floating body regions from the active body regions so that the floating body regions have floating potentials; and wherein the innermost termination cell is electrically coupled to the gate regions of the transistor cells while the rest of the termination cells are electrically floating.

13. The termination structure of claim 12, further comprising at least one gate runner disposed in the semiconductor layer in said termination area, wherein the gate runner comprises a runner trench opened from the top surface of said semiconductor layer and having sidewalls and a bottom, wherein the runner trench includes a runner insulation layer lining the runner trench sidewalls and bottom, and a runner conduction layer filling the runner trench; and wherein the innermost termination cell is electrically coupled to the gate regions through the gate runner.

14. The termination structure of claim 12, wherein the second innermost termination cell is also electrically coupled to the gate regions.

15. The termination structure of claim 12, wherein the rest of the termination cells except the innermost termination cell are regrouped into a plurality of termination cell groups, wherein each of the termination cell group comprises a predetermined number of the termination cells selected among the rest of termination cells, and wherein the termination cells within each termination cell group are electrically coupled together and have a floating potential.

16. The termination structure of claim 12, further comprising at least one reduced surface field ("RESURF") region of the first conductivity type, wherein the at least one RESURF region is formed in the termination area and located more inner than the innermost termination cell, and wherein the at least one RESURF region has a depth smaller than a depth of the floating body regions.

17. The termination structure of claim 16, wherein the innermost termination cell is decoupled from the gate regions.

18. A method of forming a field effect transistor comprising:

providing a semiconductor layer of a first conductivity type, wherein the semiconductor layer includes an active area and a termination area outside of the active area;

forming a second conductivity type body region in the semiconductor layer, wherein the second conductivity type is opposite to the first conductivity type;

forming a plurality of gate regions in the active area;

forming a plurality of termination cells in the termination area, wherein forming the termination cells comprises: forming a plurality of termination trenches opened from a top surface of the semiconductor layer, wherein the plurality of termination trenches are arranged substantially in parallel from an inner side toward an outer side of the termination area, and wherein each of the termination trenches has sidewalls and a bottom; forming a termination insulation layer lining the sidewalls and bottom of each of the termination trenches, and forming a termination conduction layer filling the termination trenches;

forming a plurality of source regions of the first conductivity type in the active cell area, wherein the source regions are located laterally adjacent to both sides of the gate regions; and electrically coupling the innermost termination cell among the plurality of termination cells to the gate regions.

19. The method of claim 18, further comprising electrically coupling the second innermost termination cells to the gate regions.

20. The method of claim 18 further comprising:

forming at least one reduced surface field ("RESURF") region of the first conductivity type in the termination area, wherein the at least one RESURF region is located more inner than the innermost termination cell.

* * * * *